(12) United States Patent
Prieur

(10) Patent No.: US 8,826,999 B2
(45) Date of Patent: *Sep. 9, 2014

(54) FIRE SUPPRESSION CONTROL

(71) Applicant: International Business Machines Corporation, Armonk, NY (US)

(72) Inventor: Jean-Claude Prieur, Montpellier (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/903,079

(22) Filed: May 28, 2013

(65) Prior Publication Data

US 2013/0255973 A1 Oct. 3, 2013

Related U.S. Application Data

(63) Continuation of application No. 12/889,480, filed on Sep. 24, 2010, now Pat. No. 8,490,709.

(51) Int. Cl.
*A62C 2/00* (2006.01)
*H05K 7/14* (2006.01)
*A62C 37/36* (2006.01)
*A62C 2/10* (2006.01)
*A62C 2/24* (2006.01)
*A62C 3/16* (2006.01)
*H05K 7/20* (2006.01)

(52) U.S. Cl.
CPC .............. *A62C 3/16* (2013.01); *H05K 7/1495* (2013.01); *A62C 37/36* (2013.01); *A62C 2/10* (2013.01); *A62C 2/247* (2013.01); *H05K 7/20745* (2013.01)
USPC ............................................. 169/46; 169/49

(58) Field of Classification Search
CPC ............ A62C 2/10; A62C 2/06; A62C 35/00; A62C 37/04
USPC ........................ 169/43, 45–49, 54, 60, 61, 68
See application file for complete search history.

(56) References Cited

U.S. PATENT DOCUMENTS 4,059,059 A 11/1977 Hughes
4,077,474 A 3/1978 Hattori
(Continued)

OTHER PUBLICATIONS

Data Center Curtains Hot/Cold Aisle Containment Curtains, www.42u.com, retrieved from the Internet Apr. 15, 2010, 2 pages.

(Continued)

*Primary Examiner* — Davis Hwu
(74) *Attorney, Agent, or Firm* — Schmeiser, Olsen & Watts; John Pivnichny

(57) ABSTRACT

An air management system including a component rack with shelves, a retractable air management structure mechanically attached to the component rack, and an activation apparatus including an electromechanical release device and a fire detection sensor. The retractable air management structure includes a flexible sheet rollably mounted on a spring loaded roller mounted internal to a housing. The flexible sheet is configured to extend from a rolled position on the spring loaded roller to an extended position. The flexible sheet in the extended position is configured to direct a flow of air through the component rack. The flexible sheet includes a thermally insulative and fire retardant material. The electromechanical release device is configured to automatically release the spring loaded roller if the fire detection sensor detects a fire within a specified area surrounding the component rack.

20 Claims, 6 Drawing Sheets

(56) References Cited

U.S. PATENT DOCUMENTS

| | | | |
|---|---|---|---|
| 4,580,638 A | 4/1986 | Jones et al. | |
| 4,791,994 A | 12/1988 | Ho | |
| 5,195,594 A | 3/1993 | Allen et al. | |
| 8,490,709 B2 * | 7/2013 | Prieur | 169/46 |
| 2010/0252283 A1 | 10/2010 | Klimek et al. | |
| 2012/0073840 A1 | 3/2012 | Prieur | |
| 2012/0134110 A1 | 5/2012 | Chang | |

OTHER PUBLICATIONS

Simplex Isolation Systems—Data Center Curtains, www.globalspec.com, retrieved from the Internet Apr. 15, 2010, 1 page.

Data Center Design: PTS Data Center Solutions Showcase, www.bestbusinesscontinuity.info, retrieved from the Internet Apr. 15, 2010, 3 pages.

Office Action (Mail Date Nov. 20, 2012) for U.S. Appl. No. 12/889,480, filed Sep. 24, 2010.

Amendment filed Dec. 24, 2012 in response to Office Action (Mail Date Nov. 20, 2012) for U.S. Appl. No. 12/889,480, filed Sep. 24, 2010.

Final Office Action (Mail Date Jan. 23, 2013) for U.S. Appl. No. 12/889,480, filed Sep. 24, 2010.

Amendment After Final filed Mar. 12, 2013 in response to Final Office Action (Mail Date Jan. 23, 2013) for U.S. Appl. No. 12/889,480, filed Sep. 24, 2010.

Notice of Allowance (Mail Date Mar. 19, 2013) for U.S. Appl. No. 12/889,480, filed Sep. 24, 2010.

* cited by examiner

FIRE SUPPRESSION CONTROL

This application is a continuation application claiming priority to Ser. No. 12/889,480 filed Sep. 24, 2010, now U.S. Pat. No. 8,490,709, issued Jul. 23, 2013.

FIELD

The present invention relates to a system and associated method for managing airflow and fire suppression control in a data center.

BACKGROUND

Directing flow patterns typically comprises an inefficient process with little flexibility. Accordingly, there exists a need in the art to overcome the deficiencies and limitations described herein above.

SUMMARY

The present invention provides a system comprising: a component rack with shelves; a retractable air management structure mechanically attached to the component rack, wherein the retractable air management structure comprising a flexible sheet rollably mounted on a spring loaded roller mounted internal to a housing, wherein the flexible sheet is configured to extend from a rolled position on the spring loaded roller to an extended position extending from a top of the component rack to an electromechanical release device, wherein the flexible sheet in the extended position is configured to direct a flow of air through the component rack, wherein the flexible sheet extended in the extended position is configured to be placed in the rolled position on the spring loaded roller, and wherein the flexible sheet comprises a thermally insulative and fire retardant material; and an activation apparatus comprising an electromechanical release device and a fire detection sensor, wherein the electromechanical release device is configured to automatically release the spring loaded roller if the fire detection sensor detects a fire within a specified area surrounding the component rack, wherein the electromechanical release device automatically releasing the spring loaded roller results in the flexible sheet extended in the extended position being placed in the rolled position on the spring loaded roller, and wherein the flexible sheet being placed in the rolled position on the spring loaded roller results in the flexible sheet uncovering a pathway above the component rack.

The present invention provides a method comprising: providing a system comprising a component rack with shelves, a retractable air management structure mechanically attached to the component rack, and an activation apparatus comprising an electromechanical release device and a fire detection sensor, wherein the retractable air management structure comprises a flexible sheet rollably mounted on a spring loaded roller mounted internal to a housing; extending the flexible sheet from a rolled position on the spring loaded roller to an extended position extending from a top of the component rack to the electromechanical release device; directing, by the flexible sheet in the extended position, a flow of air through the component rack, wherein the flexible sheet extended in the extended position is configured to be placed in the rolled position on the spring loaded roller, and wherein the flexible sheet comprises a thermally insulative and fire retardant material; detecting, by the fire detection sensor, a fire within a specified area surrounding the component rack; automatically releasing, by the electromechanical release device in response to the detecting, the spring loaded roller resulting in the flexible sheet being placed in the rolled position on the spring loaded roller, wherein the flexible sheet being placed in the rolled position on the spring loaded roller results in the flexible sheet uncovering a pathway above the component rack.

The present invention provides a computer program product, comprising a computer readable storage medium having a computer readable program code embodied therein, the computer readable program code comprising an algorithm that when executed by a computer processor of a computing system implements a method for controlling a system comprising a component rack with shelves, a retractable air management structure mechanically attached to the component rack, and an activation apparatus comprising an electromechanical release device and a fire detection sensor, wherein the retractable air management structure comprises a flexible sheet rollably mounted on extending the flexible sheet from a rolled position on the spring loaded roller to an extended position extending from a top of the component rack to the electromechanical release device; directing, by the flexible in the extended position, a flow of air through the component rack, wherein the flexible sheet extended in the extended position is configured to be placed in the rolled position on the spring loaded roller; and wherein the flexible sheet comprises a thermally insulative and fire retardant material; detecting, by the fire detection sensor, a fire within a specified area surrounding the component rack; and automatically releasing, by the electromechanical release device in response to the detecting, the spring loaded roller resulting in the flexible sheet being placed in the rolled position on the spring loaded roller, wherein the flexible sheet being placed in the rolled position on the spring loaded roller results in the flexible sheet uncovering a pathway above the component rack.

The present invention advantageously provides a simple method and associated system capable of directing flow patterns.

DETAILED DESCRIPTION

Figure 1:
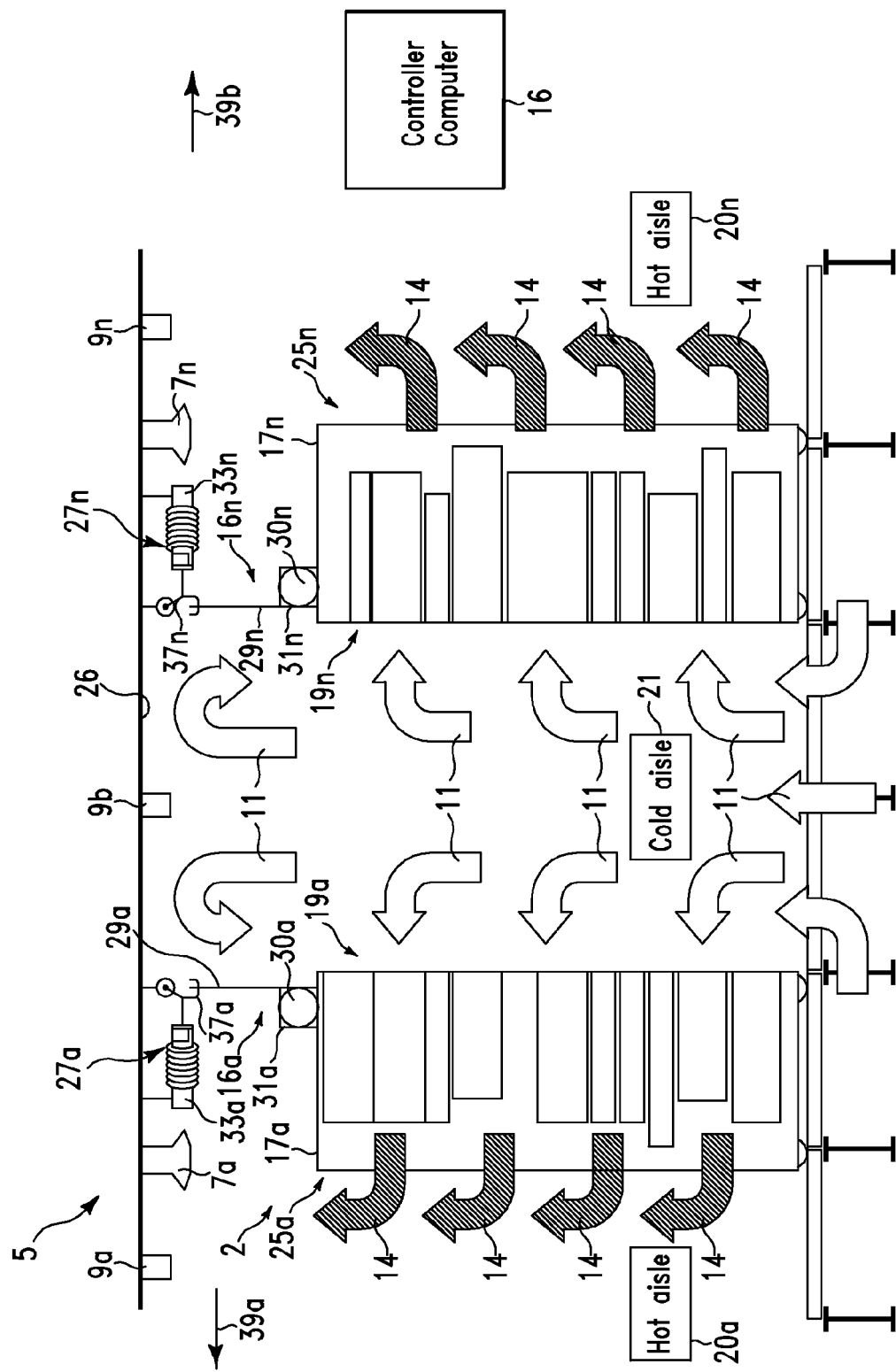
FIG. 1 illustrates side view of a system for managing airflow and fire suppression control in a data center, in accordance with embodiments of the present invention.

FIG. 1 illustrates side view of a system 5 for managing airflow and fire suppression control in a data center 2, in accordance with embodiments of the present invention. Although system 5 is described with respect to datacenter 2 (i.e., a room comprising multiple computers/servers storing data), note that system 5 may be associated with respect to any type of room or building comprising any type of electro/ mechanical devices. System 5 in FIG. 1 is illustrated in a normal mode prior to a fire detection event. Data center 2 comprises component racks 17a ... 17n (with shelves) and electrical components 19a ... 19n on each of the shelves. The electrical components may comprise any type of electrical/mechanical devices such as, inter alia, computers, servers, data storage devices, power supplies, etc. System 5 allows for a separation of cold air fluxes 11 and hot air fluxes 14 in data center 2. The separation of cold air fluxes 11 and hot air fluxes 14 is performed by cold corridors or hot corridors. Cold air fluxes 11 retrieve cold air from an air conditioning system. Cold air fluxes 11 are directed into a cold air aisle 21 and directed (i.e., by ceiling 26 and retractable air management structures 16a ... 16n) through component racks 17a ... 17n comprising electrical components 19a ... 19n. As cold air fluxes 11 flow through component racks 17a ... 17n and over electrical components 19a ... 19n, cold air fluxes 11 are converted into hot air fluxes 14 (i.e., by a heat transfer process associated with cooling electrical components 19a ... 19n). Hot air fluxes 14 are directed into a hot air aisle 21 and directed (i.e., by ceiling 26 and retractable air management structures 16a ... 16n) back into the air conditioning system for conversion to cold air fluxes 11. System 5 allows retractable air management structures 16a ... 16n to retract during a fire in order to allow a fire suppression system to operate as described, infra.

Figure 3:
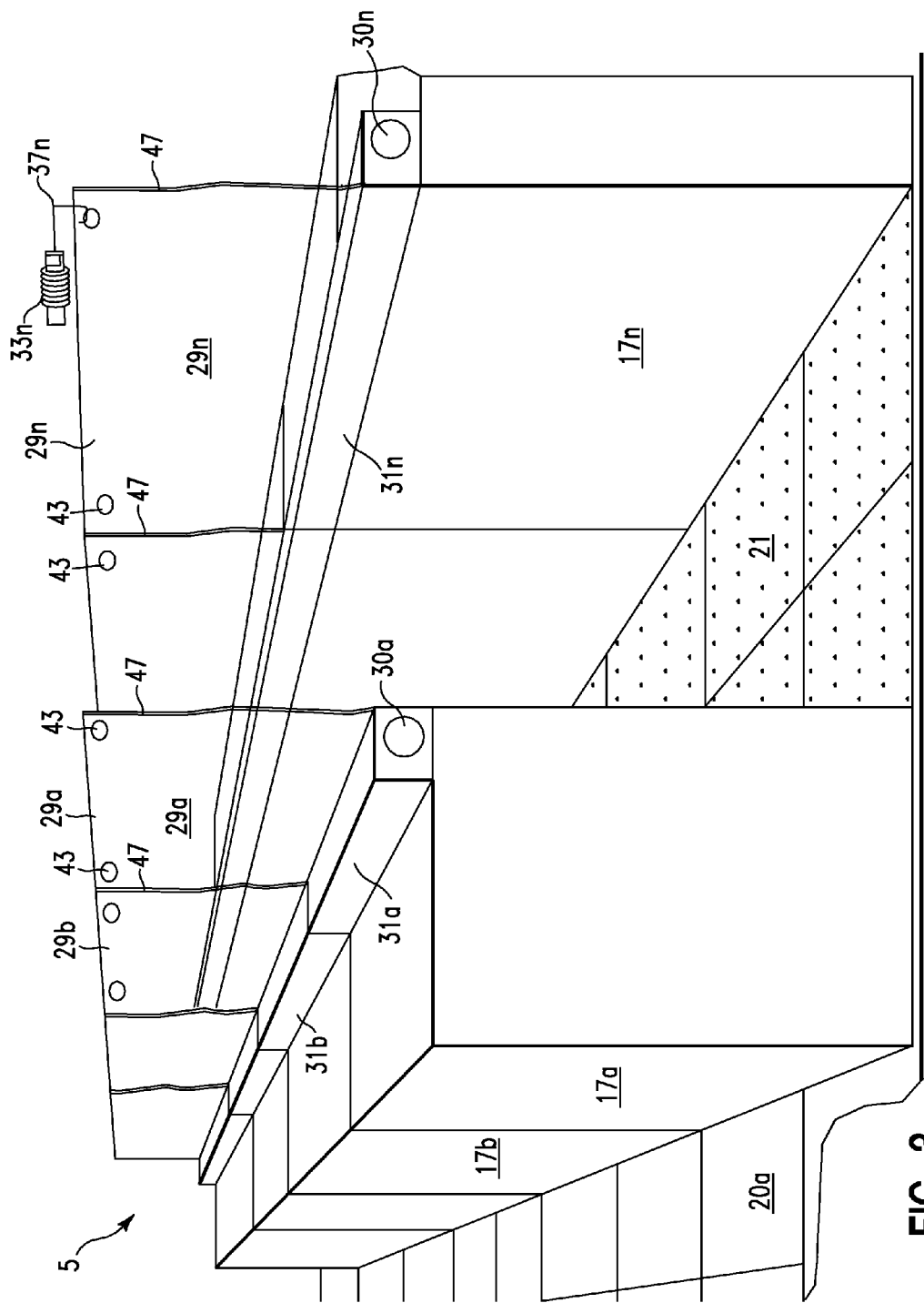
FIG. 3 illustrates a perspective view of the system of FIG. 1, in accordance with embodiments of the present invention.
Figure 4:
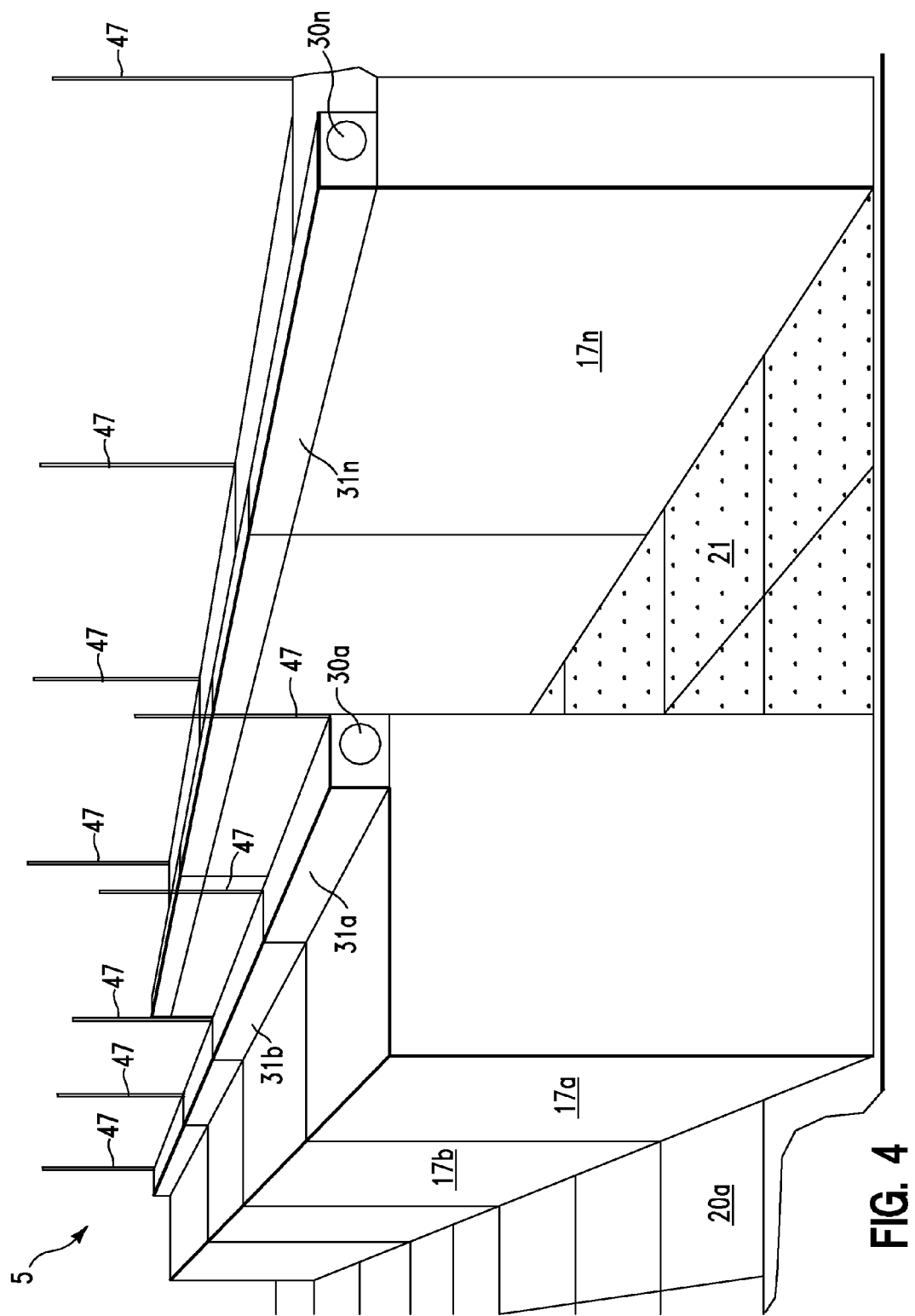
FIG. 4 illustrates a perspective view of the system of FIG. 2, in accordance with embodiments of the present invention.

System 5 of FIG. 1 comprises component racks 17a ... 17n (e.g., IT racks) comprising electrical components 19a ... 19n on shelves, retractile air management structures 16a ... 16n, activation apparatuses 27a ... 27n, fire detection sensors 9a ... 9n, fire suppression material release apparatuses 7a ... 7n, and a controller computer 16. Retractile air management structures 16a ... 16n are mechanically attached (e.g., via screws, bolts, pins, etc) to component racks 17a ... 17n. Retractile air management structures 16a ... 16n comprise flexible sheets (or shades) 29a ... 29n rollably mounted on spring loaded rollers 30a ... 30n mounted internal to housings 31a ... 31n. For example, retractile air management structure 16a comprises flexible sheet 29a rollably mounted on spring loaded roller 30a mounted internal to housing 31a, retractile air management structure 16n comprises flexible sheet 29n rollably mounted on spring loaded roller 30n mounted internal to housing 31n, etc. In FIG. 1, flexible sheets 29a ... 29n are extended from rolled positions on associated spring loaded roller 30a ... 30n to extended positions extending from tops 25a ... 25n of associated component racks 17a ... 17n to associated electromechanical release devices 33a ... 33n. Flexible sheets 29a ... 29n in extended positions are configured to direct a flow of air (i.e., cold air fluxes 11 and hot air fluxes 14) through component racks component racks 17a ... 17n. Flexible sheets 29a ... 29n may additionally ride in tracks extending from housings 31a ... 31n to ceiling 26 (i.e., as illustrated in FIGS. 3 and 4). Flexible sheets 29a ... 29n in extended positions are configured to be placed in rolled positions on spring loaded rollers 30 ... 30n. Flexible sheets 29a ... 29n comprise thermally insulative and fire retardant materials (e.g., thermal emergency blankets). Activation apparatuses 27a ... 27n comprise electromechanical release devices 33a ... 33n and pivoting hook devices 37a ... 37n. Electromechanical release devices 33a ... 33n and pivoting hook devices 37a ... 37n may be mechanically attached to ceiling 26. Electromechanical release devices 33a ... 33n may comprise any type of electro/mechanical device including, inter alia, a solenoid, a stepper motor, etc.

Figure 2:
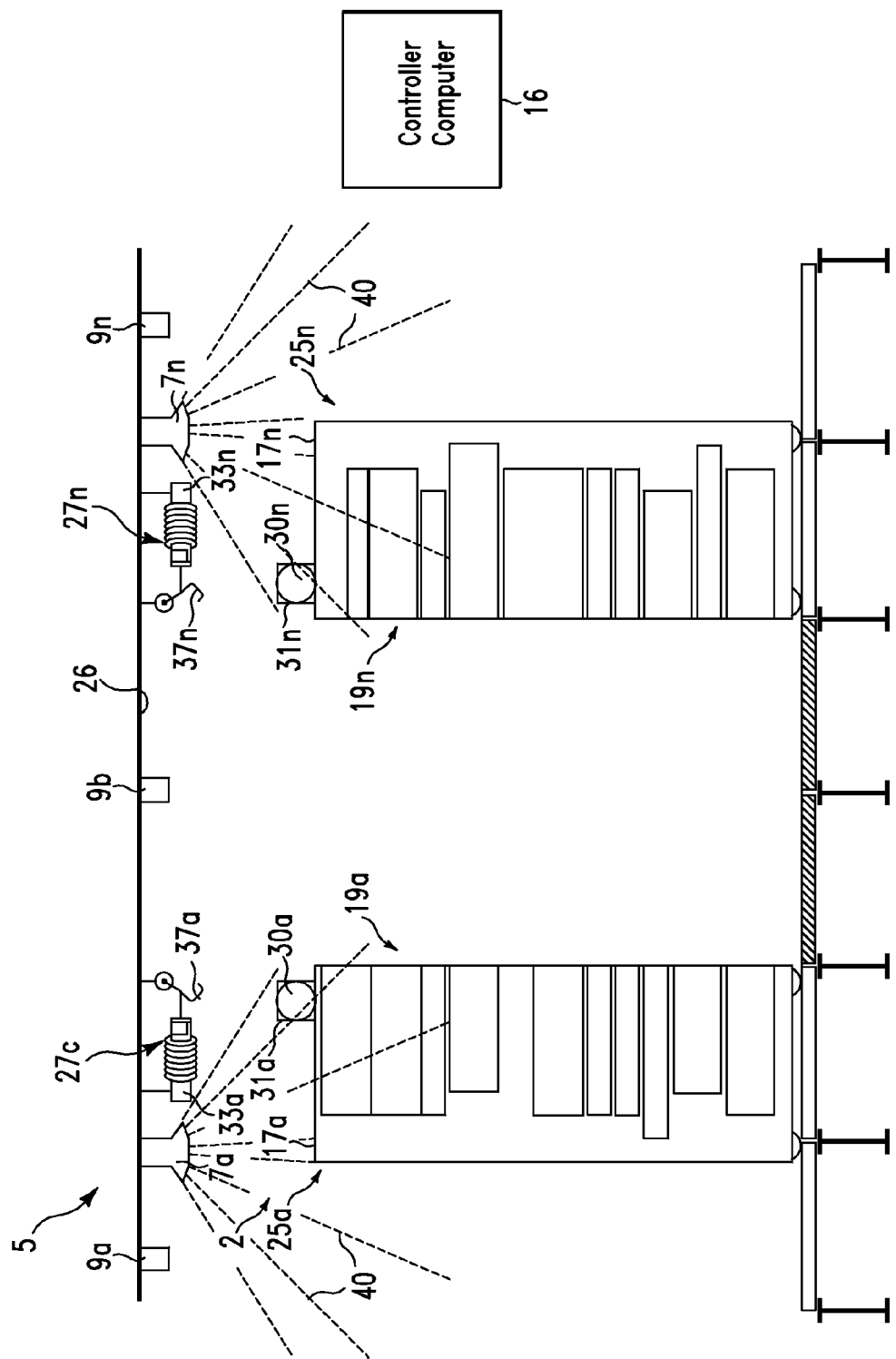
FIG. 2 illustrates a side view of the system of FIG. 1 after a fire detection event has been enabled, in accordance with embodiments of the present invention.

Upon detecting a fire (i.e., within a specified area surrounding component racks 17a ... 17n), fire detection sensors 9a ... 9n (e.g., smoke detectors, heat sensors, etc) transmit feedback signals to controller computer 16 and in response controller computer 16 transmits first control signals to electromechanical release devices 33a ... 33n and second control signals to fire suppression material release apparatuses 7a ... 7n. In response to the first control signals, electromechanical release devices 33a ... 33n activate and pull back (e.g., electromechanical release device 33a is pulled back in direction 39a and electromechanical release device 33b is pulled back in direction 39b) on pivoting hook devices 37a ... 37n (i.e., as illustrated in FIG. 2) thereby releasing flexible sheets 29a ... 29n such that spring loaded rollers 30a ... 30n retreat and place flexible sheets 29a ... 29n in a rolled position on spring loaded rollers 30a ... 30n. Alternatively, spring loaded rollers 30a ... 30n may comprise motors instead of springs such that when electromechanical release devices 33a ... 33n activate and pull back (i.e., in response to the first control signals), the motors spin (spring loaded) rollers 30a ... 30n thereby placing flexible sheets 29a ... 29n in a rolled position on (spring loaded) rollers 30a ... 30n. The aforementioned processes result in flexible sheets 29a ... 29n uncovering a pathway above component racks 17a ... 17n (i.e., as illustrated in FIG. 2). This allows fire suppression material release apparatuses 7a ... 7n to spread a fire suppression material (unimpeded by flexible sheets 29a ... 29n) over component racks 17a ... 17n. The fire suppression material may include, inter alia, a dry chemical powder fire suppression material, a foam chemical fire suppression material, water, etc.

FIG. 2 illustrates a side view of system 5 of FIG. 1 after a fire detection event has been enabled, in accordance with embodiments of the present invention. In contrast to FIG. 1, FIG. 2 illustrates electromechanical release devices 33a ... 33n activated and pulled back on pivoting hook devices 37a ... 37n such that flexible sheets 29a ... 29n have retreated in a rolled position on spring loaded rollers 30a ... 30n resulting in in flexible sheets 29a ... 29n uncovering a pathway above component racks 17a ... 17n. This allows fire suppression material release apparatuses 7a ... 7n to spread a fire suppression material 40 over component racks 17a ... 17n in order to suppress a fire unimpeded. Additionally, controller computer 16 has transmitted a third control signal for disabling a cold airflow from the air conditioning system thereby removing cold air fluxes 11 and hot air fluxes 14.

FIG. 3 illustrates a perspective view of system 5 of FIG. 1, in accordance with embodiments of the present invention. System 5 in FIG. 3 is illustrated in a normal mode prior to a fire detection event. System 5 in FIG. 3 additionally illustrates openings 43 in flexible sheets 29a ... 29n. Openings 43 are used for pivoting hook devices 37a ... 37n to hold flexible sheets 29a ... 29n up.

FIG. 4 illustrates a perspective view of system 5 of FIG. 2, in accordance with embodiments of the present invention. System 5 in FIG. 4 is illustrated with electromechanical release devices 33a ... 33n activated and pulled back on pivoting hook devices 37a ... 37n such that flexible sheets 29a ... 29n have retreated in a rolled position on spring loaded rollers 30a ... 30n resulting in flexible sheets 29a ... 29n uncovering a pathway above component racks 17a ... 17n.

Figure 5:
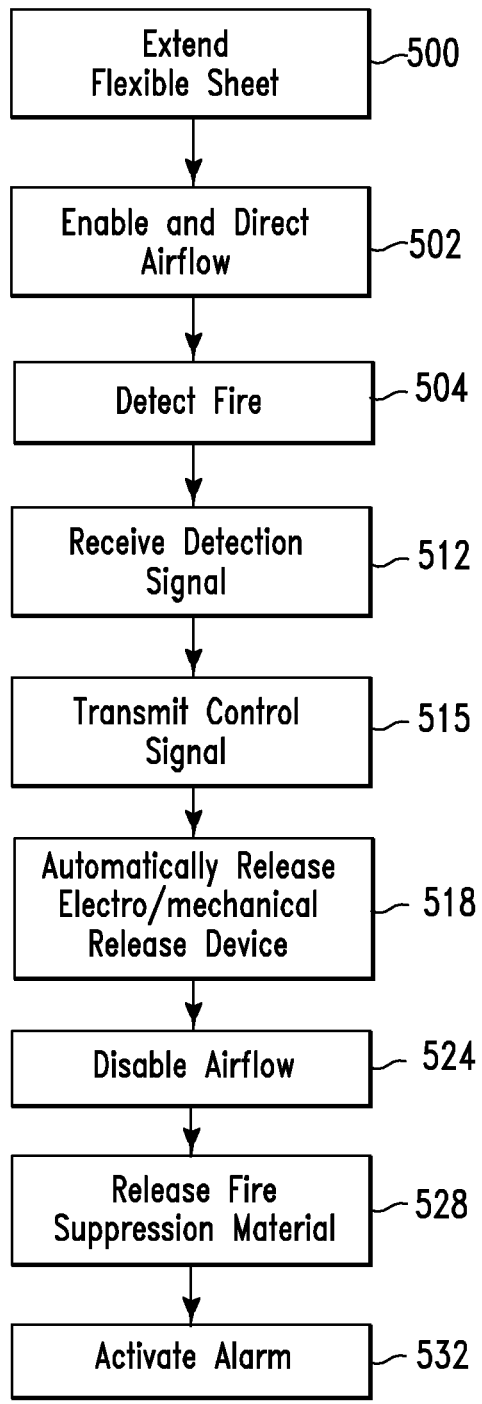
FIG. 5 illustrates an algorithm used by the system of FIGS. 1-4 for managing airflow and fire suppression control in a data center, in accordance with embodiments of the present invention.

FIG. 5 illustrates an algorithm used by system 5 of FIGS. 1-4 for managing airflow and fire suppression control in data center 2, in accordance with embodiments of the present invention. In step 500, flexible sheets (e.g., flexible sheets 29a ... 29n of FIGS. 1-4) are extended and held in place by pivoting hook devices (e.g., pivoting hook devices 37a ... 37n of FIGS. 1-4). The flexible sheets may be extended manually by a user. Alternatively, the flexible sheets may be extended automatically by (for example) a motor device (internal to spring loaded rollers 30a . . . 30n) receiving a control signal from a computer processor of a computing device (e.g., controller computer 16 in FIG. 1). In step 502, the computer processor enables (i.e., turns on) an air conditioning system. The air flow from the air conditioning system is directed (by the flexible sheets in the extended positions) through component racks (comprising computers). In step 504, fire detection sensors (i.e., comprised by system 5 of FIGS. 1-4) detect a fire within a specified area surrounding the component racks. In step 512 (in response to detecting the fire), the fire detection sensors transmit detection signals to the computer processor. In step 515, (i.e., in response to the detection signals), the computer processor transmits the control signals to electromechanical release devices (e.g., electromechanical release devices 33a . . . 33n of FIGS. 1-4). In step 518 (i.e., in response to the control signals), the electromechanical release devices activate and pull back on pivoting hook devices (e.g., pivoting hook devices 37a . . . 37n in FIGS. 1-4) thereby releasing the flexible sheets such that spring loaded rollers (e.g., spring loaded rollers 30a . . . 30n in FIGS. 1-4) retreat and place the flexible sheets 29a . . . 29n in a rolled position on the spring loaded rollers. Alternatively, the spring loaded rollers may comprise motors instead of springs such that when the electromechanical release devices activate and pull back the motors spin the rollers thereby placing the flexible sheets in a rolled position on the rollers. This results in the flexible sheets uncovering a pathway above the component racks. In step 524, the computer processor optionally disables the air conditioning system. In step 528, the computer processor, enables fire suppression material release apparatuses (e.g., fire suppression material release apparatuses 7a . . . 7n of FIGS. 1-4) to spread a fire suppression material over the component racks in order to suppress the fire. In step 532, the computer processor optionally activates a fire alarm.

Figure 6:
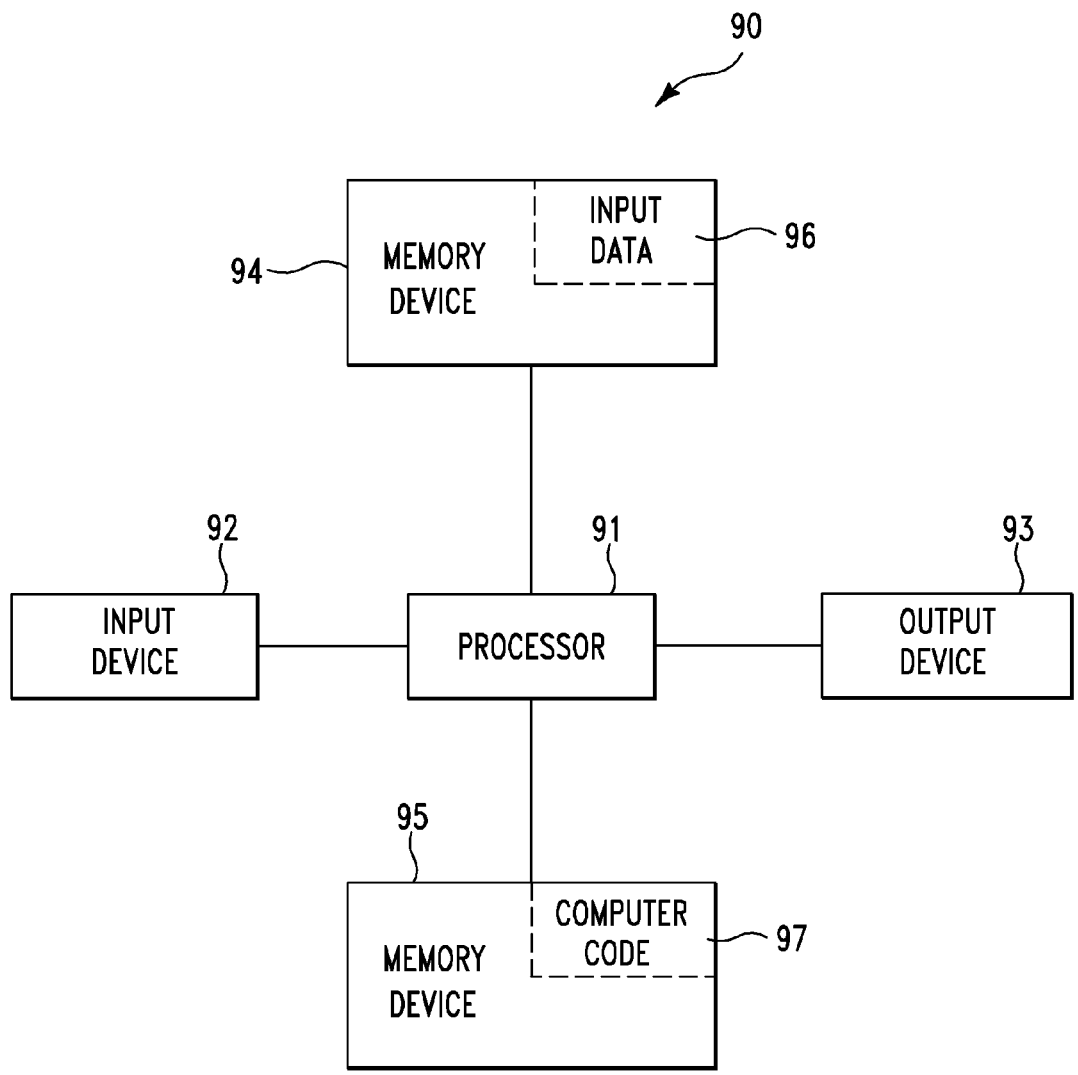
FIG. 6 illustrates a computer apparatus used for managing airflow and fire suppression control in a data center, in accordance with embodiments of the present invention.

FIG. 6 illustrates a computer apparatus 90 (e.g., controller computer 16 in FIG. 1) used for managing airflow and fire suppression control in a data center, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a software application, a mouse, etc. The output device 93 may be, inter alia, a printer, a plotter, a computer screen, a magnetic tape, a removable hard disk, a floppy disk, a software application, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes algorithms (e.g., the algorithm of FIG. 5) for managing airflow and fire suppression control in a data center. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 6) may comprise the algorithm of FIG. 5 and may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise the computer usable medium (or said program storage device).

Still yet, any of the components of the present invention could be created, integrated, hosted, maintained, deployed, managed, serviced, etc. by a service provider who offers to manage airflow and fire suppression control in a data center. Thus the present invention discloses a process for deploying, creating, integrating, hosting, maintaining, and/or integrating computing infrastructure, comprising integrating computer-readable code into the computer system 90, wherein the code in combination with the computer system 90 is capable of performing a method for managing airflow and fire suppression control in a data center. In another embodiment, the invention provides a method that performs the process steps of the invention on a subscription, advertising, and/or fee basis. That is, a service provider, such as a Solution Integrator, could offer to manage airflow and fire suppression control in a data center. In this case, the service provider can create, maintain, support, etc. a computer infrastructure that performs the process steps of the invention for one or more customers. In return, the service provider can receive payment from the customer(s) under a subscription and/or fee agreement and/or the service provider can receive payment from the sale of advertising content to one or more third parties.

While FIG. 6 shows the computer system 90 as a particular configuration of hardware and software, any configuration of hardware and software, as would be known to a person of ordinary skill in the art, may be utilized for the purposes stated supra in conjunction with the particular computer system 90 of FIG. 6. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A system comprising:
    a retractable air management structure mechanically attached to a component rack with shelves, wherein said retractable air management structure comprises a flexible sheet rollably mounted on a spring loaded roller mounted internal to a housing, wherein said flexible sheet is configured to extend from a rolled position on said spring loaded roller to an extended position extending from a top of said component rack to an electromechanical release device, wherein said flexible sheet in said extended position is configured to direct a flow of air through said component rack, wherein said flexible sheet extended in said extended position is configured to be placed in said rolled position on said spring loaded roller, and wherein said flexible sheet comprises a thermally insulative and fire retardant material;
    an activation apparatus comprising said electromechanical release device and a fire detection sensor, wherein said electromechanical release device is configured to automatically release said spring loaded roller if said fire detection sensor detects a fire within a specified area surrounding said component rack, wherein said electromechanical release device automatically releasing said spring loaded roller results in said flexible sheet extended in said extended position being placed in said rolled position on said spring loaded roller, and wherein said flexible sheet being placed in said rolled position on said spring loaded roller results in said flexible sheet uncovering a pathway above said component rack;

a cooling system configured to generate a flow of cool air, wherein said cool air is directed through said component rack by said roller in said extended position; and a controller computer configured to transmit a control signal to said cooling system, wherein said control signal is configured to disable said flow of cool air.

2. The system of claim 1, further comprising a controller computer configured to receive a detection signal from said fire detection sensor if said fire detection sensor detects a fire and provide a control signal to said electromechanical release device in response to said detection signal, wherein said control signal is configured to enable said electromechanical release device to automatically release said spring loaded roller.

3. The system of claim 2, further comprising a material release system configured to release a fire suppression material upon receiving said detection signal from said fire detection sensor and receiving a signal from said controller computer indicating that said electromechanical has automatically released said spring loaded roller.

4. The system of claim 3, wherein said fire suppression material comprises a material selected from the group consisting of a dry chemical powder fire suppression material, a foam chemical fire suppression material, and water.

5. The system of claim 1, wherein said fire detection sensor comprises a sensor selected from the group consisting of a smoke detection sensor and a heat detection sensor.

6. The system of claim 1, wherein said component rack comprises a track mechanism extending from said top of said component rack to said electromechanical release device, and wherein said flexible sheet in said extended position comprises portions that ride in said track mechanism.

7. The system of claim 1, wherein said electromechanical release device comprises a device selected from the group consisting of a solenoid and a stepper motor.

8. The system of claim 1, wherein said an electromechanical release device comprises an electromechanical device connected to a release shaft.

9. The system of claim 1, further comprising an electrical component on a first shelf of said shelves.

10. The system of claim 1, wherein said activation apparatus further comprises pivoting hook devices mechanically attached to a ceiling above said pathway.

11. The system of claim 1, wherein said electromechanical release device is configured to pull back on said pivoting hook devices to perform said automatically releasing.

12. A method comprising:

providing a system comprising a retractable air management structure mechanically attached to a component rack with shelves, a cooling system, a controller computer, and an activation apparatus comprising an electromechanical release device and a fire detection sensor, wherein said retractable air management structure comprises a flexible sheet rollably mounted on a spring loaded roller mounted internal to a housing;

extending said flexible sheet from a rolled position on said spring loaded roller to an extended position extending from a top of said component rack to said electromechanical release device;

generating, by said cooling system, a flow of cool air;

directing, by said flexible sheet in said extended position, said flow of cool air through said component rack, wherein said flexible sheet extended in said extended position is configured to be placed in said rolled position on said spring loaded roller, and wherein said flexible sheet comprises a thermally insulative and fire retardant material;

detecting, by said fire detection sensor, a fire within a specified area surrounding said component rack; and automatically releasing, by said electromechanical release device in response to said detecting, said spring loaded roller resulting in said flexible sheet being placed in said rolled position on said spring loaded roller, wherein said flexible sheet being placed in said rolled position on said spring loaded roller results in said flexible sheet uncovering a pathway above said component rack; and transmitting, by said controller computer, a control signal to said cooling system resulting in disabling said flow of cool air.

13. The method of claim 12, wherein said system further comprises a controller computer, and wherein said method further comprises:

receiving, by said controller computer from said fire detection sensor, a detection signal indicating said fire; and transmitting, by said controller computer in response to said receiving said detection signal, a control signal to said electromechanical release device; and enabling, by said control signal, said electromechanical release device to perform said automatically releasing.

14. The method of claim 13, wherein said system further comprises a material release system, and wherein said method further comprises:

receiving, by said material release system, a signal from said controller computer indicating said automatically releasing; and releasing, by said material release system, a fire suppression material.

15. The method of claim 14, wherein said fire suppression material comprises a material selected from the group consisting of a dry chemical powder fire suppression material, a foam chemical fire suppression material, and water.

16. The method of claim 12, wherein said fire detection sensor comprises a sensor selected from the group consisting of a smoke detection sensor and a heat detection sensor.

17. The method of claim 12, wherein said component rack comprises a track mechanism extending from said top of said component rack to said electromechanical release device, and wherein said flexible sheet in said extended position comprises portions that ride in said track mechanism.

18. The method of claim 12, wherein said electromechanical release device comprises a device selected from the group consisting of a solenoid and a stepper motor.

19. The method of claim 12, wherein said an electromechanical release device comprises an electromechanical device connected to a release shaft.

20. A computer program product, comprising a computer readable storage medium having a computer readable program code embodied therein, the computer readable program code comprising an algorithm that when executed by a computer processor of a computing system implements a method for controlling a system comprising, a retractable air management structure mechanically attached to a component rack with shelves, a cooling system, and an activation apparatus comprising an electromechanical release device and a fire detection sensor, wherein said retractable air management structure comprises a flexible sheet rollably mounted on extending said flexible sheet from a rolled position on said spring loaded roller to an extended position extending from a top of said component rack to said electromechanical release device;

generating, by said cooling system, a flow of cool air;

directing, by said flexible sheet in said extended position, said flow of cool air through said component rack, wherein said flexible sheet extended in said extended position is configured to be placed in said rolled position on said spring loaded roller, and wherein said flexible sheet comprises a thermally insulative and fire retardant material;

detecting, by said fire detection sensor, a fire within a specified area surrounding said component rack;

automatically releasing, by said electromechanical release device in response to said detecting, said spring loaded roller resulting in said flexible sheet being placed in said rolled position on said spring loaded roller, wherein said flexible sheet being placed in said rolled position on said spring loaded roller results in said flexible sheet uncovering a pathway above said component rack; and transmitting, by a controller computer, a control signal to said cooling system resulting in disabling said flow of cool air.

* * * * *